(12) United States Patent
Horning et al.

(10) Patent No.: US 6,684,469 B2
(45) Date of Patent: Feb. 3, 2004

(54) METHOD FOR FORMING AN ACTUATOR ARRAY DEVICE

(75) Inventors: Robert Horning, Savage, MN (US); Burgess Johnson, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 82 days.

(21) Appl. No.: 10/077,495

(22) Filed: Feb. 15, 2002

(65) Prior Publication Data

US 2002/0125790 A1 Sep. 12, 2002

Related U.S. Application Data

(62) Division of application No. 09/613,489, filed on Jul. 11, 2000.

(51) Int. Cl.⁷ .............................. H04R 17/00; B31F 1/20
(52) U.S. Cl. ....................... 29/25.35; 29/594; 29/831; 29/841; 29/846; 156/210
(58) Field of Search .................... 29/29.35, 594, 29/846, 831, 841; 156/210, 291, 292, 196; 427/77, 96, 508, 516, 207.1

(56) References Cited

U.S. PATENT DOCUMENTS

| | | | |
|---|---|---|---|
| 2,975,307 A | 3/1961 | Schroeder et al. ............. 310/6 |
| 3,070,775 A | 12/1962 | Andrews, Jr. ................. 340/10 |
| 4,135,108 A | 1/1979 | Besson ........................ 310/344 |
| 4,234,245 A | 11/1980 | Toda et al. .................. 350/269 |
| 4,295,010 A | 10/1981 | Murphy .................... 179/110 A |
| 4,654,546 A | 3/1987 | Kirjavainen ................. 307/400 |
| 5,144,528 A * | 9/1992 | Watanabe et al. ......... 361/321.1 |
| 5,176,358 A | 1/1993 | Bonne et al. ............. 251/30.05 |
| 5,206,557 A | 4/1993 | Bobbio ........................ 310/309 |
| 5,290,400 A * | 3/1994 | Bobbio ........................ 216/13 |
| 5,350,966 A | 9/1994 | Culp ........................... 310/328 |
| 5,413,489 A * | 5/1995 | Switky .......................... 439/71 |
| 5,434,464 A | 7/1995 | Bobbio et al. ............... 310/309 |
| 5,438,232 A * | 8/1995 | Inoue et al. ................. 310/328 |
| 5,517,467 A | 5/1996 | Fromont et al. ............. 367/155 |
| 5,534,740 A | 7/1996 | Higuchi et al. .............. 310/309 |
| 5,563,466 A | 10/1996 | Rennex et al. .............. 310/309 |
| 5,682,075 A | 10/1997 | Bolleman et al. ........... 310/309 |
| 5,757,456 A * | 5/1998 | Yamazaki et al. ........... 349/151 |
| 5,761,782 A | 6/1998 | Sager ........................ 29/25.35 |
| 6,184,608 B1 | 2/2001 | Cabuz et al. ................ 310/309 |
| 6,255,758 B1 | 7/2001 | Cabuz et al. ................ 310/309 |

OTHER PUBLICATIONS

C. Cubuz, et al. "High Reliability Touch–Mode Electrostatic Actuators", Technical Digest of the Solid State Sensor and Actuator Workshop, Hilton Head, S.C., Jun. 8–11, 1998, pp. 296–299.

C. Cabuz, "Tradeoffs in MEMS Materials" Proceedings of the SPIE, vol. 2881, pp. 160–170, Austin TX.

U.S. patent application Ser. No. 09/613,489, filed Jul. 11, 2000, entitled "MEMS Actuator With Lower Power Consumption And Lower Cost Simplified Fabrication."

U.S. patent application Ser. No. 09/476,667, filed Dec. 30, 1999, entitled "Microactuator Array With Integrally Formed Package."

* cited by examiner

*Primary Examiner*—A. Dexter Tugbang
*Assistant Examiner*—Tai Nguyen
(74) *Attorney, Agent, or Firm*—Matthew Luxton; Brian N. Tufte

(57) ABSTRACT

A method of manufacturing a microactuator device includes a plurality of generally parallel thin flexible sheets bonded together in a predetermined pattern to form an array of unit cells. Preferably, each of the sheets has only a single electrode layer located on one side of the sheet. Pairs of such sheets are then bonded together at spaced bonding locations with the electrode layers facing one another. Several sets of such sheet pairs can then be bonded together to form a microactuator device.

9 Claims, 8 Drawing Sheets

METHOD FOR FORMING AN ACTUATOR ARRAY DEVICE

RELATED APPLICATIONS

This application is a divisional of U.S. patent application Ser. No. 09/613,489, filed Jul. 11, 2000.

This Application is related to U.S. patent application Ser. No. 09/233,368 to Cabuz et al., filed Dec. 29, 1998, entitled "POLYMER MICROACTUATOR ARRAY WITH MACROSCOPIC FORCE AND DISPLACEMENT", now U.S. Pat. No. 6,184,608; and to U.S. patent application Ser. No. 09/476,667 to Horning, filed Dec. 30, 1999, entitled "MICROACTUATOR ARRAY WITH INTEGRALLY FORMED PACKAGE", now U.S. Pat. No. 6,411,013, both of which are incorporated herein by reference.

This invention was made with government support under DARPA contract Number F30602-98-0217. The government has certain rights in the invention.

FIELD OF THE INVENTION

The present invention relates to microactuators having macroscopic force and displacement. More particularly, the invention relates to microactuators comprising a 3-D array of small actuator cells, which are formed from stacked substrate sheets having an electrode layer on only one side of the substrate sheet.

BACKGROUND OF THE INVENTION

Most microactuator arrays, used as MEMS (Micro-Electro-Mechanical-Systems) devices, are fabricated in silicon. Despite the many favorable attributes of silicon, it is not always a suitable or ideal material for every application of MEMS. Silicon is brittle and subject to breaking, particularly as the total device size increases. This brittleness limits devices, especially actuators, to relatively small sizes capable of only small displacements and forces. The shapes that can be realized in silicon are typically restricted by crystalline planes or 2-D fabrication processes, and more complicated structures often result in prohibitively high cost and low yield. It would be of great advantage to the art if another material, other than silicon, could be used for MEMS and actuators. In particular, it would be advantageous if the structure used to fabricate the actuator required significantly fewer electrode layers with no substantial loss in force, while requiring less power to operate.

SUMMARY OF THE INVENTION

The present invention provides an electrostatic microactuator array device including a plurality of sheet pairs secured together over the sheet pair lengths and widths. The sheet pairs can be formed of a first sheet and a second sheet, wherein the first and second sheets have a front and back surface. The first and second sheets preferably have a substrate layer disposed toward the sheet back surface, a dielectric layer disposed toward the sheet front surface, and a conductive layer disposed between the substrate layer and the dielectric layer. Voltage applied to the conductive layers causes an attractive electrostatic force between the first and second sheets. The first and second sheet front surfaces are secured together at a number of spaced bonding locations along the sheet lengths and widths, such that the first and second sheets have a plurality of non-bonded regions between the bonding locations. In this configuration, the sheet pairs have outer surfaces formed of the back surfaces of the first and second sheets. The outer surfaces of the adjacent sheet pairs are secured together over the sheet pair lengths and widths to form an array of sheet pairs.

In one illustrative embodiment, the sheet pairs are bonded together along continuous bonded locations extending across the sheets. These bonded locations may be disposed along substantially straight lines or curved lines, as desired. Alternatively, the bonded locations may be a discontinuous series of spots or lines extending over the sheet surface.

The first and second sheets may lie substantially flat between the bonding regions, relying on an applied tension to the microactuator to separate the sheets. Alternatively, the sheet pairs may be pre-shaped to form cavities between the bonded regions, even with no applied tension to the microactuator. This latter configuration may be accomplished in any number of ways. For example, the first sheet may be curved, and the second sheet may be substantially flat. In this configuration, the first sheet undulates away from the second flat sheet between the bonded locations. In another example, both the first and second sheets may curve away from each other in the non-bonded regions, coming back together at the bonded locations. The curved or corrugated sheets may thus form cavities between the bonding regions even with no applied tension to the microactuator. In any event, it is contemplated that the sheet pairs may collectively be aligned substantially along a plane, or may conform to a curved surface.

The sheets included in the present invention require only a single electrode layer bonded or applied to a substrate layer. The electrode layer is preferably formed of a conductor material deposited over the substrate layer, and a dielectric material deposited over the conductor. The substrate layer may be a polymer, ceramic, silicon, steel, or any other material that provides the desired characteristics for a particular application. The first and second sheets of each pair can be bonded together so that the front surfaces of the sheets are in close proximity to one another near the bonded regions. The close proximity of the sheets helps overcome the initial separation of the non-bonded regions of the sheets, and zip together inward from the bonding locations toward the center of the non-bonded regions. The attraction of the sheets for each other upon the application of an electrical potential provides the force for the microactuator.

In one method of manufacture, the sheet pairs are formed by first bonding together the sheets at periodic intervals, for example, along regularly spaced parallel lines. This can be done using manufacturing techniques such as heat bonding or adhesive application. With the sheet pairs formed, the sheet pairs can be bonded together many at a time, to form the microactuator array. The process of bonding together the multiple, already formed sheet pairs can be less precise with little or no loss in device performance than the process used to bond the sheets of a sheet pair. Since no voltage is applied between the sheet pairs, the distance between the sheet pairs may not be as critical as the distance between the sheets forming each pair.

DETAILED DESCRIPTION OF THE INVENTION

Figure 1:
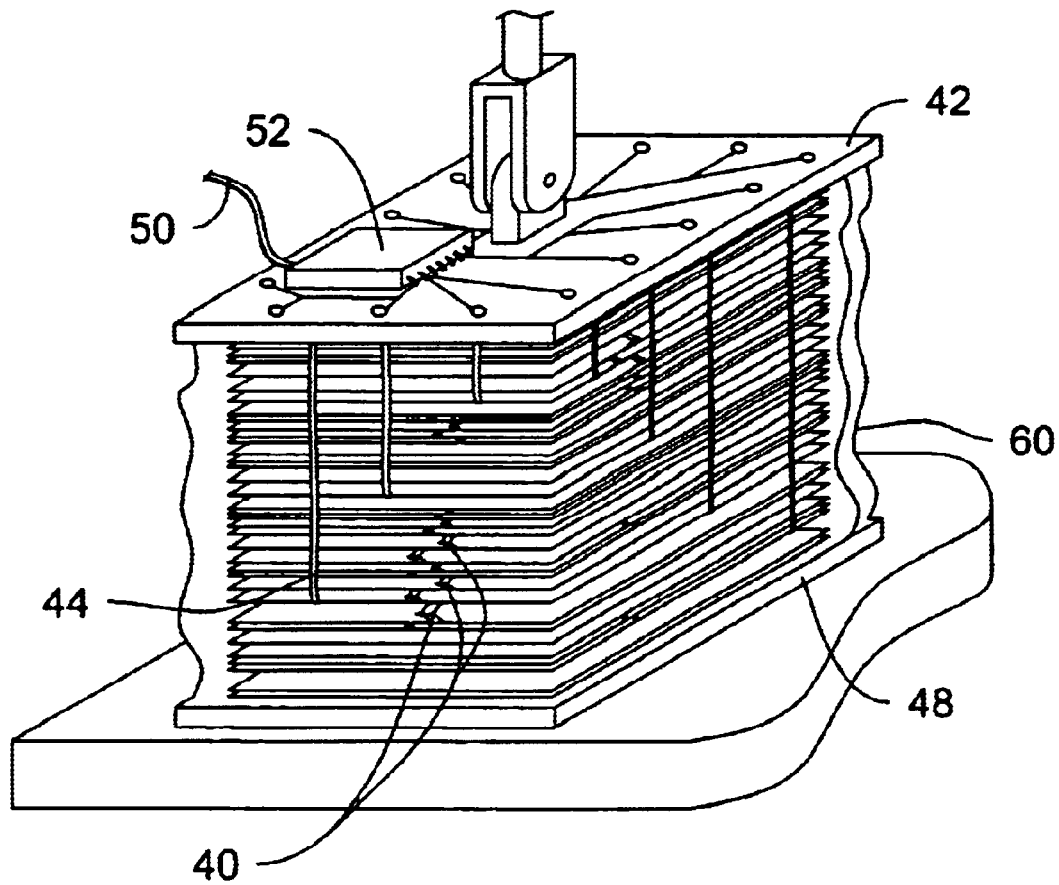
FIG. 1 is a partial cut-away perspective view of a microactuator using polymer sheets.

FIG. 1 is a partial cut-away perspective view of a microactuator using polymer sheets. The illustrative microactuator is formed by stacking and bonding together multiple polymer sheets, as described in for example, U.S. patent application Ser. No. 09/233,368 to Cabuz et al., filed Dec. 29, 1998, entitled "POLYMER MICROACTUATOR ARRAY WITH MACROSCOPIC FORCE AND DISPLACEMENT", now U.S. Pat. No. 6,184,608; and to U.S. patent application Ser. No. 09/476,667 to Horning, filed Dec. 30, 1999, entitled "MICROACTUATOR ARRAY WITH INTEGRALLY FORMED PACKAGE", now U.S. Pat. No. 6,411,013, both of which are incorporated herein by reference.

As described in the above references, electrodes from selected sheets can be electrically tied together or can be individually addressed, depending on the degree of control and sophistication of the end use, noting that individual addressing requires more connections, so it would involve higher cost but finer control when needed. Electrical contact between layers and sheets can be made through flexible plastic interconnect straps, as described in U.S. patent application Ser. No. 09/233,368 to Cabuz et al., now U.S. Pat. No. 6,184,608, or through an integrally formed package, as described in U.S. patent application Ser. No. 09/476,667 to Horning, now U.S. Pat. No. 6,411,013.

In either case, the top of the microactuator stack may be secured to an upper housing 42, and the bottom of the microactuator stack is secured to a lower housing 48. The upper and/or lower housings 42 and 48 may include an external connector 50 and control circuitry 52 for controlling the microactuator. The upper and/or lower housing 42 and 48 may further include one or more levels of metal interconnects, as in a printed circuit board, to route the inputs of the external connector 50 through the control circuitry 52 and to the sheets of the actuator using one or more of the flexible interconnect straps.

Figure 2:
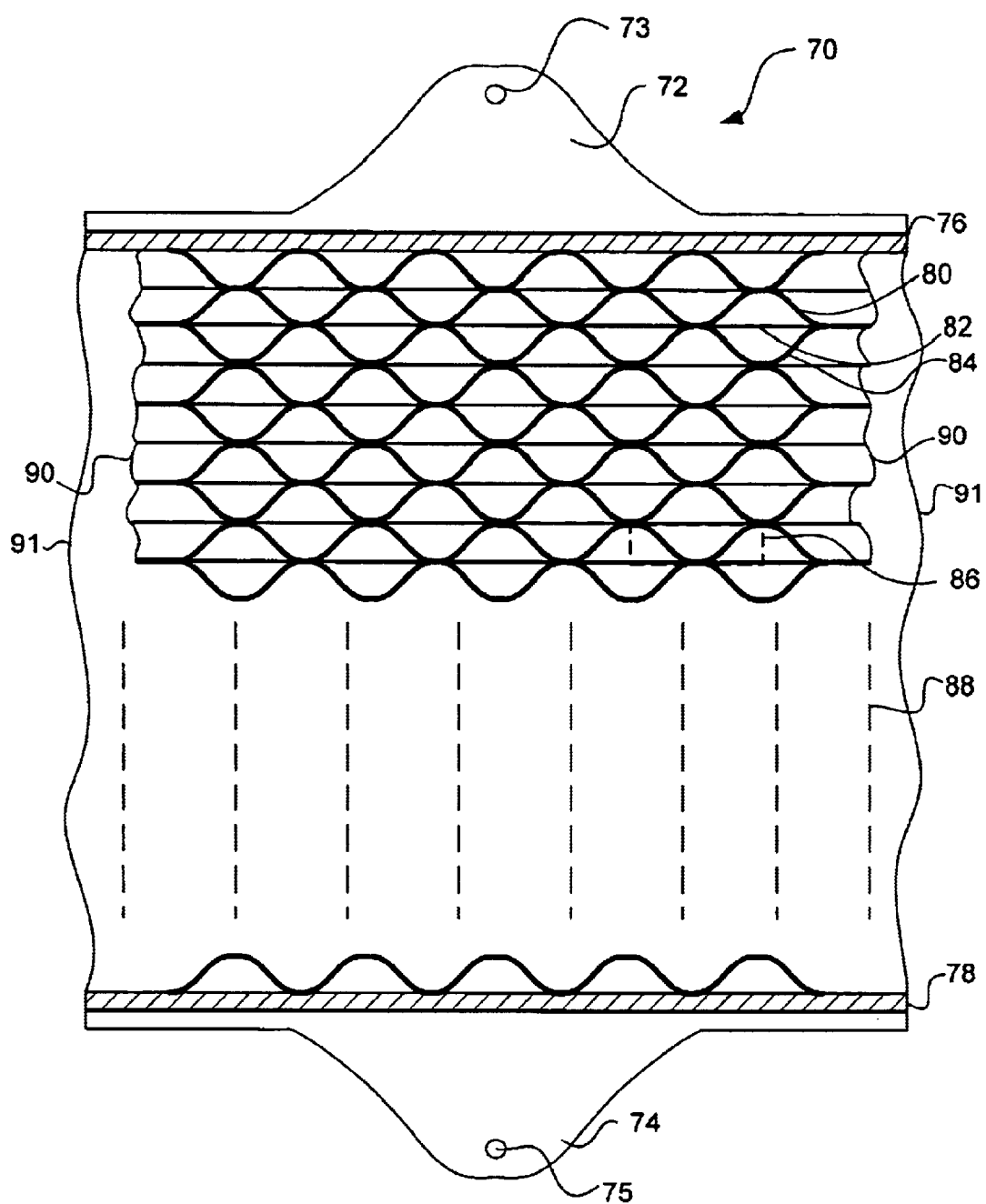
FIG. 2 is a schematic, partially cut-away and in section view of a microactuator formed of a plurality of unit cells with a center polymer sheet.

Referring now to FIG. 2, a microactuator 70 is illustrated extending from an upper housing 72 to a lower housing 74. The terms "upper" and "lower" are used herein for purposes of illustration only, as the microactuators in the general case may be used in any position. Upper housing 72 includes an upper connector 73 and lower housing 74 includes a lower connector 75, which can both be used for connecting the microactuator to other members to which force is to be applied. In one embodiment, upper housing 72 has an upper connect layer 76 and lower housing 74 has a lower connect layer 78, both of which can be used to electrically connect the electrostatically moveable unit cells and polymeric sheets discussed further below.

The embodiment illustrated in FIG. 2 includes alternating layers of polymeric sheets which can be viewed as forming repeating unit cells 86 that form the moveable elements of the microactuator. Microactuator 70 includes a first curved or bent upper polymer sheet 80, a substantially flat lower polymeric sheet 82, and a second curved or bent upper polymeric sheet 84, etc. In this embodiment, the curved sheets may be similar or identical, and each curved sheet may be more properly viewed as grouped together with the flat sheet beneath each curved sheet to form a sheet pair. The pairs may then be viewed as being secured together to form the microactuator. The polymeric sheets repeat in numerous layers, with only the upper most layers illustrated in FIG. 2, the remainder being indicated only by repetition marks 88. In a preferred embodiment, the upper and lower sheets have a substantial depth, giving rise to a three-dimensional structure.

First upper sheets 80, first lower flat sheets 82, and second upper sheets 84 are electrically connected to the upper housing 72 through electrical connection lines 90. Electrical connection lines 90 are shown in a highly diagrammatic form, and can be used to interconnect the upper and lower sheets in various combinations, as illustrated by straps 40 and 44 in FIG. 1. A protective film or envelope 91 encloses the microactuator in some embodiments, protecting the polymeric sheets from the environment. In use, microactuator 70 operates by the attraction of upper polymeric sheet 80 to lower sheet 82, and by the attraction of second curved upper polymeric sheet 84 to the flat polymeric sheet beneath it. The electrostatic attractive forces between the sheets pull the sheets closer together, acting to pull upper housing 72 toward lower housing 74.

Figure 3:
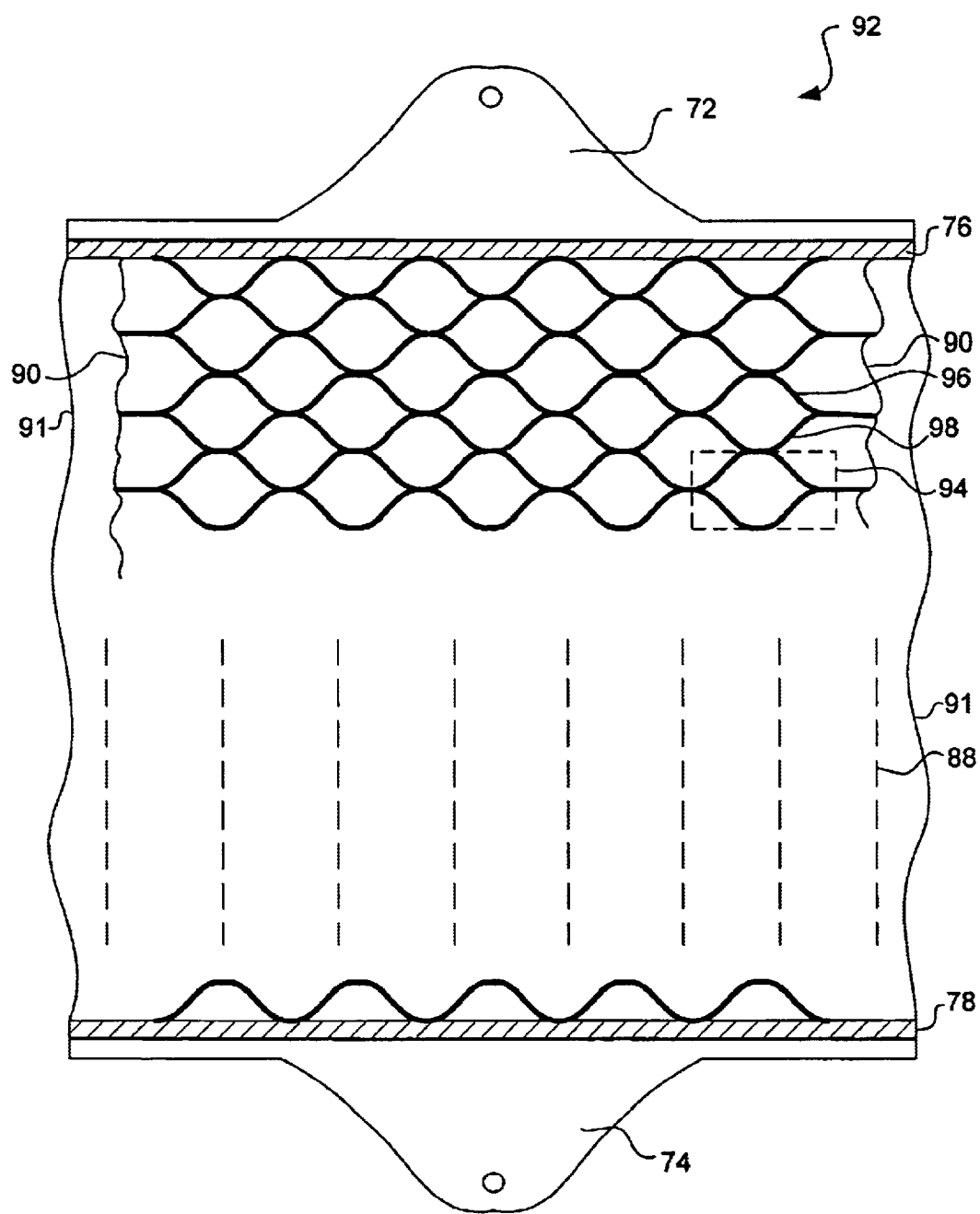
FIG. 3 is a schematic, partially cut-away and in section view of a microactuator formed of a plurality of unit cells with no center polymer sheet.

Referring now to FIG. 3, another embodiment of the invention is illustrated in a microactuator 92 also having upper housing 72, lower housing 74, electrical interconnect lines 90, and protective outer film 91. Microactuator 92, unlike microactuator 70, has no flat polymeric sheet. Microactuator 92 includes a series of curved or bent upper polymeric sheets 96 and curved or bent lower polymeric sheets 98. Microactuator 92 may be viewed as being formed of numerous repeating unit cells 94 bonded together. In particular, the polymeric sheets may be viewed as being secured together in pairs, with the assembled pairs then secured together to form the microactuator. In the embodiment illustrated, the upper and lower polymeric sheets 96 and 98 are directly secured to each other using a bonding process, which can include adhesives or other methods for securing polymers to polymers, as further described below. In use, microactuator 92 operates by the attraction of upper polymeric sheet 96 to lower polymeric sheet 98. The electrostatic attractive forces between the sheets pull the sheets closer together, acting to pull upper housing 72 toward lower housing 74.

Figure 4:
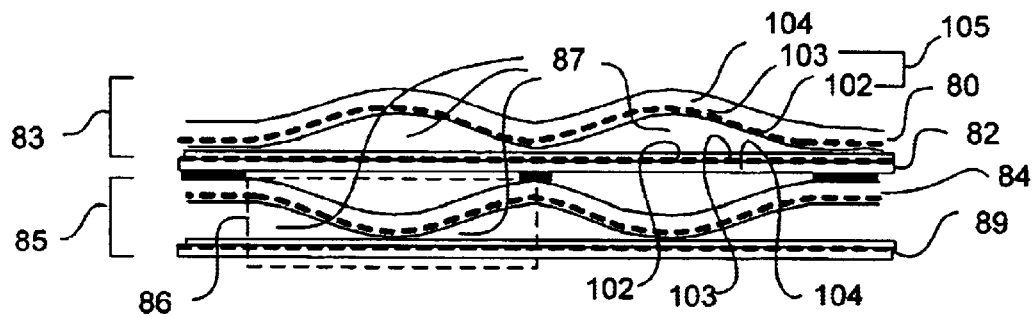
FIG. 4 is a fragmentary, schematic, cross-sectional view of unit cells of FIG. 2 formed of two polymer sheet pairs having only a single surface electrode layer on each sheet with one sheet pre-curved or allowed to bend and the other remaining substantially flat.

Referring now to FIG. 4, a unit cell such as unit cell 86 of FIG. 2 is illustrated in greater detail. First curved upper sheet 80 and first flat lower sheet 82 are also formed of an electrode layer such as electrode layer 105 adhered to polymeric layer 104, with electrode layer 105 having conductive layer 103 and dielectric layer 102. A second lower flat sheet 89 is shown beneath the second upper curved sheet 84. First upper curved sheet 80 and first lower flat sheet 82 may be considered as a sheet pair 83. Likewise, second upper curved sheet 84 and second flat lower sheet 89 may be considered another sheet pair 85. Thus, the microactuator portion illustrated in FIG. 4 may be considered to be formed of two sheet pairs 83 and 85. The opposing electrode layers of each opposing sheet in the pair may be seen to form cavities 87 which contract, thereby causing displacement of the actuator.

Figure 5:
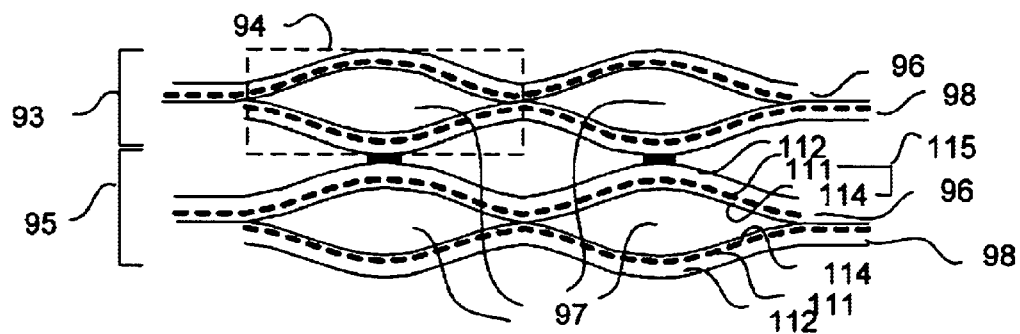
FIG. 5 is a fragmentary, schematic, cross-sectional view of unit cells of FIG. 3 formed of two polymer sheet pairs having only a single surface electrode layer with both sheets either pre-curved or allowed to bend.

Referring now to FIG. 5, a unit cell such as unit cell 94 of FIG. 3 is illustrated in greater detail. Upper polymeric sheets 96 and lower sheets 98 include a polymeric layer 112 adjacent to and coupled to an electrode layer 115 which, in this embodiment, is formed of a conductive layer 111 and a dielectric layer 114. Each upper sheet 96 and lower sheet 98 may be viewed as being secured together to form a sheet pair, such as sheet pairs 93 and 95 illustrated in FIG. 5. Numerous sheet pairs may be secured together to form the microactuator. Cavities 97 are formed between the curves or corrugations of the upper and lower sheets of each sheet pair. Cavities 97 contract with the application of electrical potential, causing displacement of the actuator.

Figure 6:
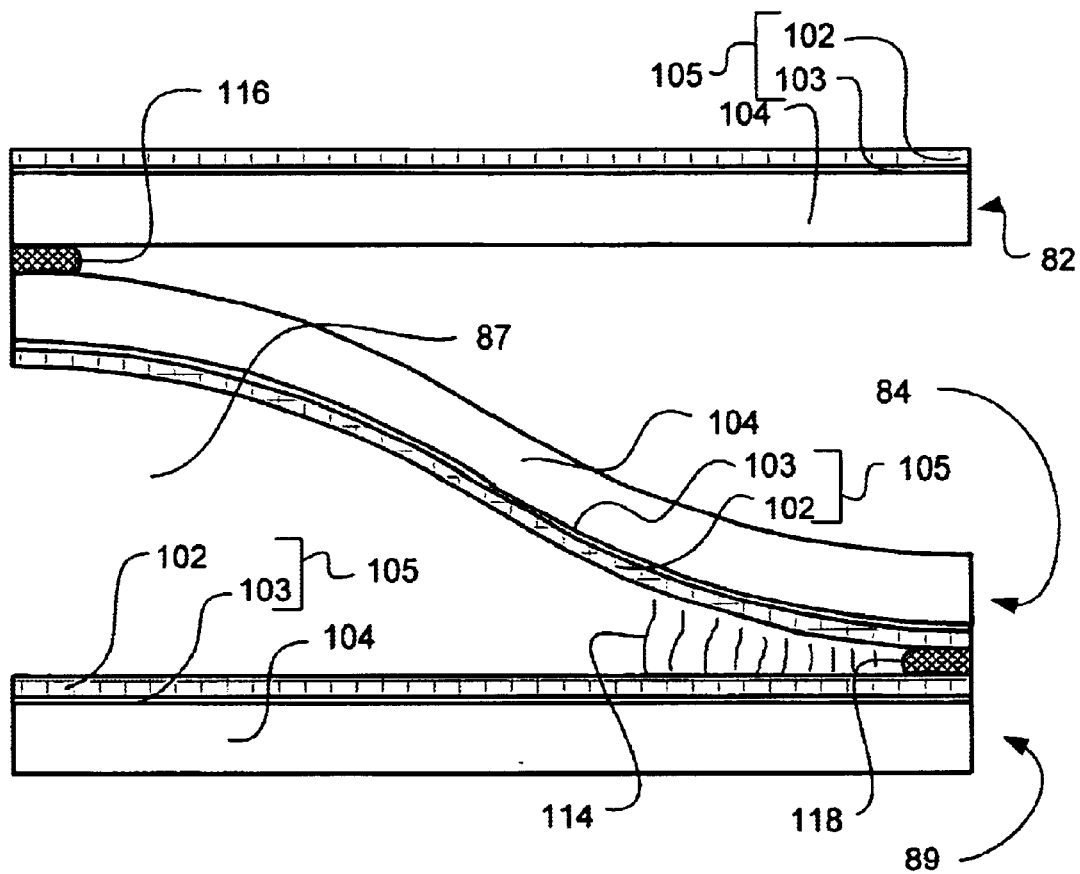
FIG. 6 is a fragmentary, schematic, cross-sectional view of part of the unit cell of FIG. 4.

Referring now to FIG. 6, part of a unit cell having a flat polymeric sheet such as unit cell 86 of FIGS. 2 and 4 is illustrated. The unit cell includes first flat lower sheet 82 at top and second lower flat sheet 89 at bottom, with the second curved upper sheet 84 extending therebetween. In the illustrative embodiment, second curved upper sheet 84 is adhered to first upper flat sheet 82 with upper adhesive 116, and is further adhered to the second upper flat sheet 89 with lower adhesive 118. Other methods for securing the second curved upper sheet 84 to first upper flat sheet 82 and/or to the second upper flat sheet 89 may include thermal sealing, ultrasonic welding, etc., particularly when the sheets are formed from materials that can be directly bonded together.

Second upper curved sheet 84 and second lower flat sheet 89 may be considered as forming a sheet pair having cavity 87 therebetween. The contraction of cavity 87 may be seen to provide the actuator displacement. In this view, first lower flat sheet 82 may be seen to form the lower part of another sheet pair. Numerous lower adhesives 118 may be viewed as periodically bonding the two sheets of the sheet pair together, forming a non-bonded region 87 therebetween. Upper adhesive 116 may be viewed as bonding two sheet pairs together.

Electric field lines 114 are illustrated in the region where conductive layers 103 of the curved upper sheet 84 and the flat sheet 89 come close together, creating as small of a gap as possible between the two dielectric layers 102. As can be seen from inspection of FIG. 6, the thickness of lower adhesive 118 can establish the limit of the gap thickness between the two sheets. The tolerances and limit of the small gap between the sheets may be important in manufacturing the microactuators. The electrostatic attraction between the two closely spaced electrodes is dependent on the separation distance. As curved upper sheet 84 is pulled down toward flat sheet 89, the gap between the two electrodes is decreased in the region more toward the center of the unit cell, which increases the attraction in the region more toward the center of the unit cell. The process of closing the gap from the outside in acts as a rolling or zipping action, acting to pull the previously spaced apart sheets together.

The individual sheets may be preformed using low cost processes, such as cutting or stamping rather than photolithography and etching. Aluminum or other metal or alloy electrodes and one or more dielectric films, such as aluminum oxide, polyimide, polyvinylidene flouride (PVdF), acrylates, or other suitable organic or inorganic dielectrics, may be applied to the sheets. The conductive portion forms the electrode, and the dielectric prevents shorting of the electrodes when they touch. These films can be patterned using standard patterning techniques, such as those used to make printed circuit boards or roll type printing processes. The dielectric layer should produce a chemically stable surface with a very low surface energy. This may be helpful in preventing stiction. The level of performance that can be obtained from an electrostatic actuator often depends in part on the dielectric strength of the material used as a dielectric.

Figure 7:
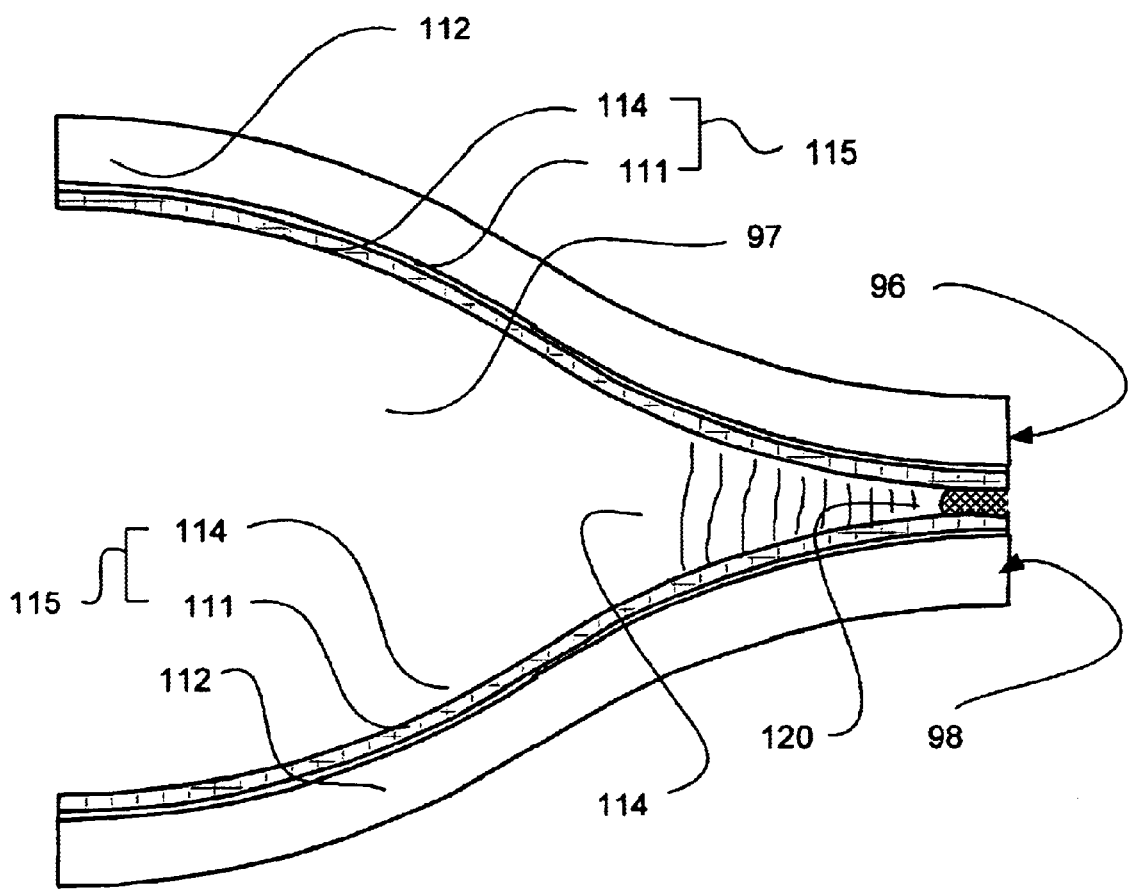
FIG. 7 is a fragmentary, schematic, cross-sectional view of part of the unit cell of FIG. 5.

Referring now to FIG. 7, part of a unit cell not having a center polymeric sheet, such as unit cell 94 of FIGS. 3 and 5, is illustrated. The unit cell includes curved upper sheet 96 and curved lower sheet 98. Upper sheet 96 is shown adhered to the lower sheet 98 with adhesive 120. Upper sheet 96 and lower sheet 98 may be viewed as forming a sheet pair, where such sheet pairs are secured together to form a microactuator. Adhesive 120 can be viewed as periodically bonding the sheet pair 96 and 98 together, forming a non-bonded region 97 therebetween. Electric field lines 114 are illustrated in the region where conductive layers 111 of upper polymeric sheet 96 and lower polymeric sheet 98 come closely together, creating a small gap between the two conductive layers.

Figure 8:
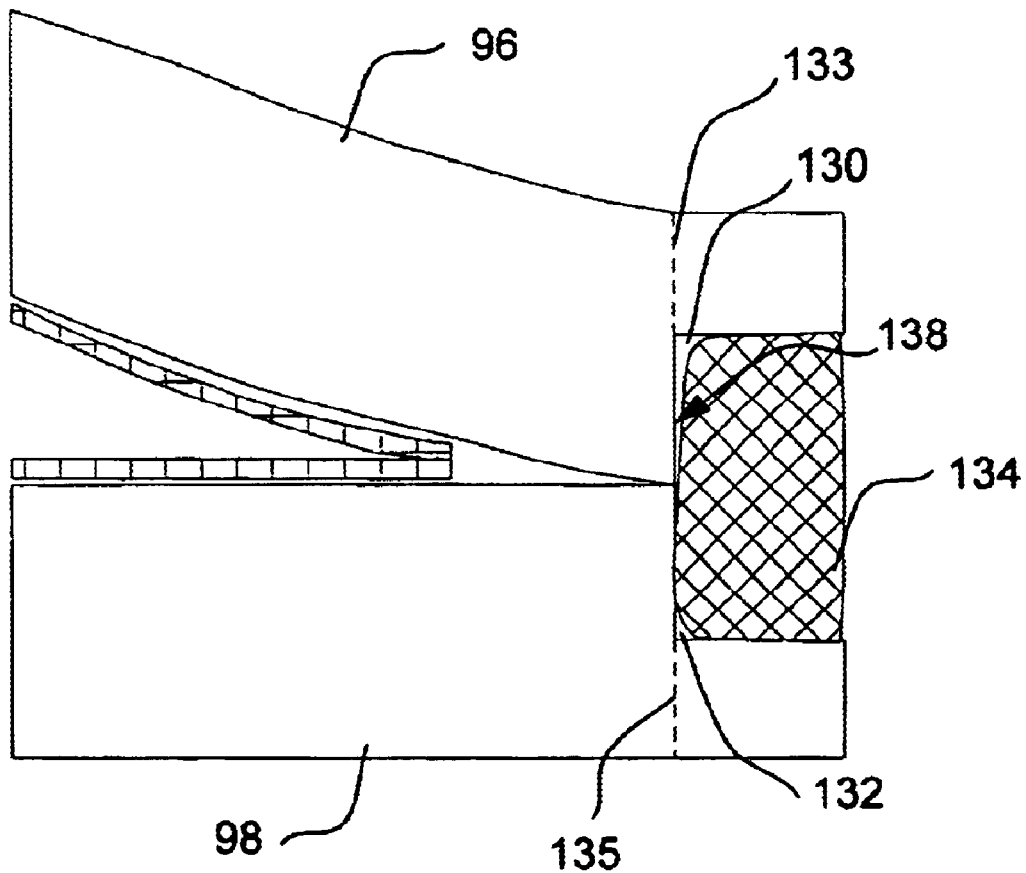
FIG. 8 is a fragmentary, schematic, cross-sectional view of part of the unit cell of FIG. 5 with a trenched bond.

As can be seen from inspection of FIG. 7, the thickness of adhesive 120 can cause a gap between the two sheets. As discussed with respect to FIG. 6, the tolerances and limit of such a gap may be important in manufacturing the microactuators, as the electrostatic attraction between the two closely spaced electrodes is dependent on the separation distance. To minimize the gap between the two sheets, a trench may be cut or etched into one or both of the sheets at the bonding locations. FIG. 8 shows a bond where a first trench 130 is cut into the upper sheet 96 and a second trench 132 is cut into the lower sheet 98. The first trench 130 and the second trench 132 are preferably in registration, as shown, and extend into the substrate of the sheet. In one embodiment, the first trench 130 may extend all the way through the upper sheet 96, as shown by dotted line 133. Likewise, the second trench 132 may extend all the way through the lower sheet 98, as shown by dotted line 135.

An adhesive 134 may be provided in the cavity formed by the first trench 130 and/or the second trench 132. Once the adhesive is provided, the two sheets 96 and 98 may be pressed together to form the bond. The first trench 130 and the second trench 132 may have a length. The adhesive preferably does not extend the full length of the trenches. This may help prevent excess adhesive from flowing outside of the trenches and between the upper and lower sheets. In some embodiments, a catalyst may be provided to help cure the adhesive. That catalyst may be, for example, heat, UV radiation, pressure, etc. An advantage of this approach is that the trenches 130 and 132 provide a cavity for the adhesive 134, thereby leaving little or no gap between the sheets. This may increase the performance of the microactuator, as further described herein. Another advantage of this approach is that the concentration of stress at the bond may be reduced.

The electrostatic field (and therefore the electrostatic energy) drops off extremely rapidly as the separation between the sheets increases. Simple estimates and finite element models show that the electrostatic field is negligible when the gap is a little over 1 $\mu$m, using typical values of 0.3 $\mu$m for the dielectric thickness and 3.0 for the dielectric constant. Therefore, the electrostatic energy can be simplified, with little loss in accuracy, by assuming it is zero everywhere that the gap is nonzero, and is constant where the gap is zero. The electrostatic energy at a fixed voltage is then simply that of a parallel plate capacitor, and can be expressed using the relation:

$$U_E = \begin{cases} -\dfrac{\varepsilon_o \varepsilon b(l-c)V^2}{4d} & \text{for single sided (ss) electrodes} \\ -\dfrac{\varepsilon_o \varepsilon b(2a)V^2}{4d} & \text{for double sided (ds) electrodes} \end{cases}$$ (Equation 1)

The term "single sided electrode" refers to a unit cell that has an electrode layer on only one side of the sheets. The term "double sided electrode" refers to a unit cell that has an electrode layer on both sides of the sheets.

Figure 9:
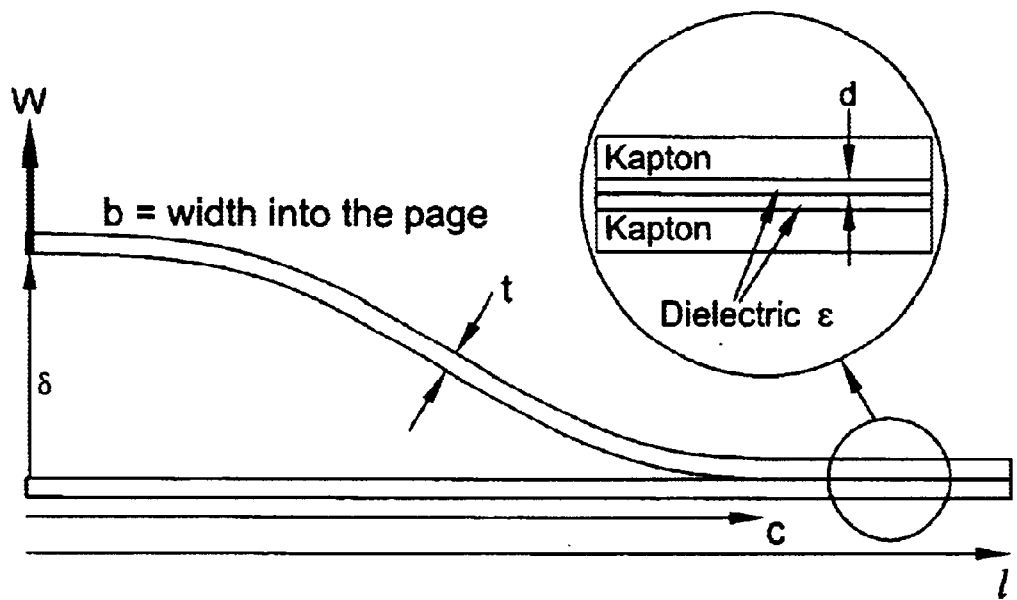
FIG. 9 is a diagram showing the model parameters for single-sided electrodes.
Figure 10:
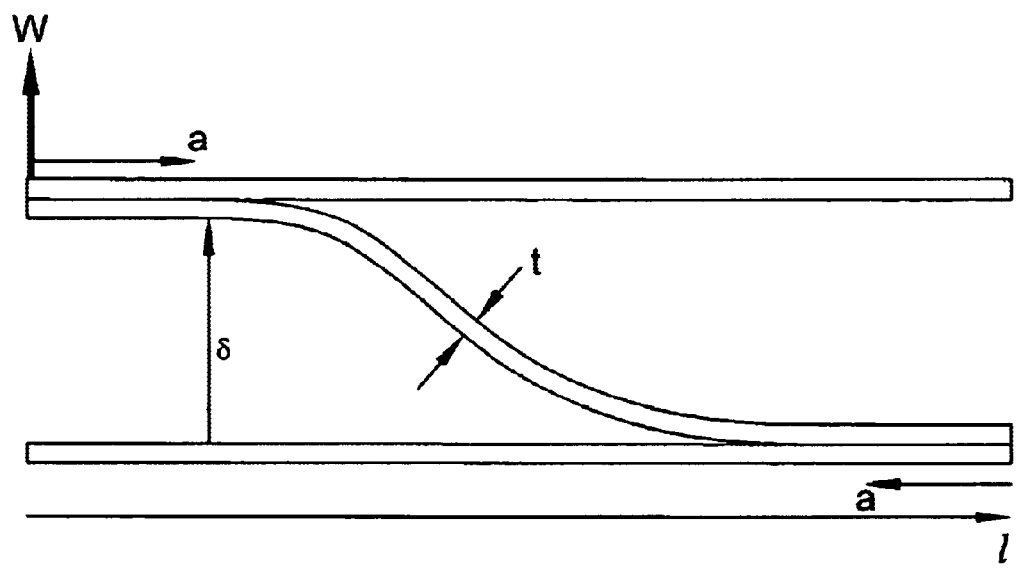
FIG. 10 is a diagram showing the model parameters for double-sided electrodes.

FIG. 9 is a diagram showing the model parameters used for unit cells made from sheets with a single-sided electrode. In the design without flat center planes (e.g. FIG. 7), the displacement δ is still defined as the distance between the two surfaces when the structure is extended. FIG. 10 is a diagram showing the model parameters used for unit cells made from sheets with double-sided electrodes.

The bending energy is derived from the curvature of the sheet. Since the electrostatic force falls off so quickly, it has very little influence on the bending profile of the sheets, although it has a strong influence on the position of the point of contact between the two sheets and, therefore, the length of the bent region. Thus, the profile is that of a beam with a load W at the end. The bending energy can thus be expressed using the relation:

$$U_B = \dfrac{Ebt^3}{24}\int\left(\dfrac{\partial^2 y}{\partial x^2}\right)^2 dx = \begin{cases} \dfrac{1}{2}kb\left(\dfrac{l}{c}\right)^3 \delta^2 & \text{for ss electrodes} \\ \dfrac{1}{2}kb\left(\dfrac{l}{l-2a}\right)^3 \delta^2 & \text{for ds electrodes} \end{cases}$$ (Equation 2)

where E is Young's modulus and k is the "spring constant" of the structure.

$$k \equiv \dfrac{W}{b\delta} = \begin{cases} \dfrac{Et^3}{l^3} & \text{with flat centerplanes} \\ \dfrac{Et^3}{2l^3} & \text{without flat centerplanes} \end{cases}$$ (Equation 3)

The total energy can be expressed using the relation:

$$U_{Total} = U_B + U_E =$$ (Equation 4)

$$\begin{cases} \dfrac{1}{2}kb\left(\dfrac{l}{c}\right)^3 \delta^2 - \dfrac{\varepsilon_o \varepsilon b(l-c)V^2}{4d} & \text{for ss electrodes} \\ \dfrac{1}{2}kb\left(\dfrac{l}{l-2a}\right)^3 \delta^2 - \dfrac{\varepsilon_o \varepsilon b(2a)V^2}{4d} & \text{for ds electrodes} \end{cases}$$

Equilibrium is achieved when $\partial U_{Total}/\partial c = 0$ for single sided electrodes or $\partial U_{Total}/\partial a = 0$ for double sided electrodes, where the partial derivatives are taken while holding the displacement, δ, constant. This yields the same answer for both single sided (ss) and double sided (ds) cases:

$$\dfrac{W}{b} = \begin{cases} \left(\dfrac{l}{6}\right)^{3/4} \dfrac{k^{1/4}}{\delta^{1/2}}\left(\dfrac{\varepsilon_0 \varepsilon V^2}{d}\right)^{3/4} & V > V_{PI} \\ k\delta & V < V_{PI} \end{cases}$$ (Equation 5)

and $$V_{PI} = \left(\dfrac{6d}{kl\varepsilon_o \varepsilon}\right)^{1/2} \dfrac{W}{b}$$ (Equation 6)

The pull-in voltage, $V_{PI}$, is the applied voltage at which the actuator rolls or zips closed, which corresponds to the voltage at which the two expressions for W/b in Equation (5) are equal. These expressions are valid for both models—with and without centerplanes.

At 0 V, the displacement is defined solely by the spring constant of the structure. If a fixed external load W is applied to the actuator, it will open to a displacement δ. As the voltage is increased from zero, an electrostatic force develops, but this electrostatic force is not large enough to move the actuator. However, once the pull-in voltage $V_{PI}$ is reached, the displacement δ begins to decrease. This increases the actuator force even more, while the external load remains fixed at W, so the actuator pulls completely in.

Since the expression for force (Equation 5) is identical for single and double sided designs, it can be concluded that only single sided electrodes are needed. This has a number of advantages. First, single side electrode processing is easier and cheaper than double side electrode processing. Double side electrode processing typically exposes the electrode and dielectric on one side to scratching, etc. while processing the other side. This may reduce the yield relative to a single side electrode process. In addition, many polymer sheets have one side that is rougher than the other. Single sided electrode processing allows only the smooth side to be processed. This is particularly important since the spacing between layers can be important to the operation of the actuator.

Another advantage of providing a single sided electrode is that the input power requirements may be reduced. The energy expended by the electrical power source in actuating a load is the sum of the mechanical work done on the load and the electrical energy stored in the capacitor: $U = W\delta + CV^2/2$. The capacitance of the actuator with double-sided electrodes is twice that of the actuator with single-sided electrodes. Therefore, twice as much electrical energy must be stored in the actuator with double-sided electrodes. Yet no additional mechanical work is performed. Further, fewer electrical interconnects may be needed.

Yet another advantage of using single-sided electrodes is that the manufacturing process may be more readily controllable with regard to the thickness of the adhesive near the gap between facing electrodes of each sheet pair. In particular, in FIG. 6, the thickness of lower adhesive 118 is much more important than the thickness of upper adhesive 116, which does not control the gap between facing electrodes. Upper adhesive 116 bonds adjacent pairs of contracting sheets. Similarly, in FIG. 7, the thickness of adhesive 120 may be critical in establishing the gap between facing electrodes, but the adhesive securing the non-electrode faces of the adjacent sheets bonds together adjacent pairs of contracting sheets. In manufacture, the two facing electrode layers can be carefully laminated using a first process designed to control the thickness of the adhesive. In one method, adhesive is not used at all, and the two facing electrode sheets are joined together using an alternate method such as heat bonding requiring little or no adhesive, insuring a very close gap between the electrode layers. The resulting "sheet pairs" can then be secured together, back to back, using a second method designed to preserve the previously formed bonds between sheets, at the possible expense of control of adhesive thickness or absolute adhesive thickness.

The force equation (5) above can also be used to compare the designs with and without the flat centerplane. From the spring constant equations (Equation 3), an actuator without centerplanes has a spring constant half that of an actuator with centerplanes. That is, they have different mechanical responses. If the actuator without centerplanes is modified so that its length is $1/(2)^{1/3}$, the two actuators have the same spring constant. Thus, at zero voltage, the two structures have exactly the same response (restoring force and displacement) to an externally applied load. For a given applied force, the pull-in voltage (Equation 6) of the design without the centerplanes is only $(2)^{1/6}=1.12$ times the pull-in voltage of the design with centerplanes, since $V_{PI}$ has a dependence on length. However, the small increase in pull-in voltage is outweighed by the much simpler fabrication of the design without centerplanes.

Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. A method for forming an actuator array device comprising:
   providing a first sheet having a front surface and a back surface;
   providing a second sheet having a front surface and a back surface;
   applying a thin conductive film on said first sheet and second sheet, and applying a dielectric film over said conductive film to locate and pattern one or more electrodes on said first and second sheets; and
   defining a first trench in the front surface of the first sheet;
   providing an adhesive in the first trench;
   positioning the front surface of the first sheet adjacent the front surface of the second sheet so that the first trench is adjacent the second sheet; and
   moving the first sheet into engagement with the second sheet.

2. A method according to claim 1 further comprising:
   defining a second trench in the front surface of the second sheet; and
   positioning the front surface of the first sheet adjacent the front surface of the second sheet so that the first trench is in registration with the second trench.

3. A method according to claim 2 further comprising:
   providing an adhesive in the second trench.

4. A method according to claim 1 wherein the first trench has a length, and the adhesive does not extend the full length of the first trench.

5. A method according to claim 1 wherein the first trench extends through the first sheet from the front surface to the back surface.

6. A method according to claim 1 further comprising applying at least one catalyst to cure the adhesive.

7. A method according to claim 6 wherein the catalyst is heat.

8. A method according to claim 6 wherein the catalyst is UV radiation.

9. A method according to claim 6 wherein the catalyst is pressure.

* * * * *